(12) United States Patent
Crawford et al.

(10) Patent No.: US 6,778,583 B2
(45) Date of Patent: Aug. 17, 2004

(54) THREE-CAVITY STABILIZED LASER SYSTEM

(75) Inventors: Devin Crawford, St. Paul, MN (US); Roger W. McGowen, Oakdale, MN (US)

(73) Assignee: ADC Telecommunications, Inc., Eden Praire, MN (US)

( * ) Notice: Subject to any disclaimer, the term of this patent is extended or adjusted under 35 U.S.C. 154(b) by 316 days.

(21) Appl. No.: 09/960,242

(22) Filed: Sep. 21, 2001

(65) Prior Publication Data

US 2003/0058905 A1 Mar. 27, 2003

(51) Int. Cl.[7] .............................................. H01S 3/08
(52) U.S. Cl. ................................... 372/97; 372/29.02
(58) Field of Search ......................... 372/97, 6, 29.01, 372/32, 96, 108

(56) References Cited

U.S. PATENT DOCUMENTS

| | | | |
|---|---|---|---|
| 5,485,481 A | * 1/1996 | Ventrudo et al. | 372/6 |
| 5,563,732 A | 10/1996 | Erdogan et al. | 359/341 |
| 5,608,524 A | 3/1997 | Blake | 356/350 |
| 5,717,804 A | 2/1998 | Pan et al. | 385/94 |
| 5,721,636 A | 2/1998 | Erdogan et al. | 359/341 |
| 5,841,797 A | * 11/1998 | Ventrudo et al. | 372/6 |
| 5,930,430 A | 7/1999 | Pan et al. | 385/94 |
| 6,058,128 A | 5/2000 | Ventrudo | 372/96 |

OTHER PUBLICATIONS

Achtenhagen, M., et al., "L–I Characteristics of Fiber Bragg Grating Stabilized 980–nm Pump Lasers", *IEEE Photonics Technology Letters, 13,* (May, 2000), 415–417.

Henry, C H., et al., "Instability of semiconductor lasers due to optical feedback from distant reflections", *IEEE Journal of Quantum Electronics, vol. QE–22, No. 2.,* (1986), 295–301 (Feb.).

Lang, R., et al., "External optical feedback effects on semiconductor injection laser properties", *IEEE Journal of Quantum Electronics, vol. QE–16, No. 3,* (1980), 347–355 (Mar.).

Mugino, A., et al., "Output power optimization in 980 nm pumping lasers wavelength–locked using fiber Bragg gratings", *Furukawa Review. n 19,* (2000), 41–46 (no month available).

Ventrudo, B. F., et al., "Wavelength and intensity stabilization of 980 nm diode lasers coupled to fiber Bragg gratings", *Electronics Letters, vol. 30, No. 25,* (1994), 2147–2149 (Dec.).

* cited by examiner

*Primary Examiner*—Quyen P. Leung
(74) *Attorney, Agent, or Firm*—Schwegman, Lundberg, Woessner & Kluth, P.A.

(57) ABSTRACT

A three-cavity stabilized laser system is disclosed. The laser system includes a laser with rear and front ends surrounding a gain medium. First and second wavelength-selective reflective elements with respective first and second overlapping reflectivity bandwidths are optically coupled to the laser. The wavelength-selective reflective elements are arranged so that the laser system operates stably in the coherence collapse lasing regime.

86 Claims, 6 Drawing Sheets

THREE-CAVITY STABILIZED LASER SYSTEM

FIELD OF THE INVENTION

The present invention relates to lasers, and in particular to lasers stabilized by selective wavelength feedback devices.

BACKGROUND OF THE INVENTION

Many lightwave systems require laser sources that output a stable wavelength over a narrow-band or a broad-band for a wide range of operating conditions. For example, in certain telecommunication systems diode lasers are used to pump active elements (e.g., erbium-doped fiber amplifers) over a wide range of temperatures and drive currents for long periods of time. The requirements on the operational stability of diode lasers as a function of temperature and drive current, as well as diode laser aging have become more demanding as the performance requirements for the system as a whole have increased.

One approach to wavelength stabilization of a laser system is through frequency-selective feedback into the laser. By way of example, with reference to FIG. 1 there is shown a prior art two-cavity fiber Bragg grating stabilized diode laser system 10 comprising a diode laser 12 with rear and front facets 14 and 16, respectively. Front facet 16 has a reflectivity $R_{FF}$. Adjacent rear facet 14 is a rear-facet monitor (RFM) 20 that is used to monitor output power and provide feedback to control the drive current supplied to the diode laser to maintain a constant output power.

An optical fiber 26 is optically coupled to diode laser 12 at front facet 16. A fiber Bragg grating 32 having a select reflectivity bandwidth (typically 1 nm or so) within the laser gain and a reflectivity $R_G$ is formed in optical fiber 26 a distance D1 from front facet 16.

In system 10, there are two discrete Fabry-Perot cavities. One cavity is within the diode laser itself between rear facet 14 and front facet 16, while the second cavity is an "external cavity" formed between the front facet and the fiber Bragg grating 32.

There are two main criteria for stable, broadband operation of system 10. The first is that the reflectivities $R_{FF}$ and $R_G$ need to be chosen such that the reflected light from the fiber Bragg grating is capable of causing system 10 to operate in what is known as the "coherence collapse" regime. From the analysis of C. Henry and R. F. Karzarinov in their article "Instability of semiconductor lasers due to optical feedback from distant reflectors," IEEE J. Quantum Electron., vol. QE–22, pp. 295–301, 1986, the relationship between the reflectivities $R_{FF}$ and $R_G$ for operation in the coherence collapse regime is:

$$R_G > (0.01) R_{FF}/(1-R_{FF})^2$$

This relationship is satisfied over a very broad range of reflectivities, including the case where $R_G \sim R_{FF}$. For the case of coupling to an optical fiber, the coupling efficiency can be folded into an effective front facet reflectivity $R_{EFF}$ The second criterion for stable operation of system 10 is that the distance D1 be greater than the coherence length L of the free running diode laser (i.e., in the absence of feedback from the fiber Bragg grating). This requirement ensures that the feedback light is incoherent with the light emitted from the diode laser. If the condition D1>L is not met, diode laser 12 experiences instabilities at semi-periodic drive currents, which cause output power fluctuations (detected by RFM 20), which adversely impact the operation of the system (see, e.g., Achtenhagen et al, "L-I characteristics of fiber Bragg grating stabilized 980-nm pump lasers, IEE Photonics Technology Letters, Vol. 13, No. 5, May 2001).

The coherence length L depends on the characteristics of the laser, and can be relatively large (i.e. greater than one meter). If the diode laser used is one that operates in a single longitudinal mode with a narrow bandwidth, the coherence length L can be relatively long, and substantially greater than that for a multi-longitudinal mode diode laser. A disadvantage of a large value of L is that the fiber Bragg grating must be placed very far away (e.g., meters) from the diode laser front facet in order to obtain stable operation of the system over the drive current operating range.

Increasing the distance D1 to ensure coherence collapse operation can create two problems. First, the required distance D1 can become impractical, particularly in applications where space is a concern such as pumped amplifier systems. Second, bi-modal behavior of the system can result from polarization rotation of the feedback light due to the natural birefringence in the fiber, which can be exacerbated by stressing or straining the fiber. This is particularly troublesome when D1 is large. For these reasons, it is preferred to keep the distance D1 as short as possible.

The problem of induced polarization rotation from fiber birefringence can be overcome by using a polarization-maintaining fiber. Polarization-maintaining fiber is designed to maintain the polarization axis of the guided light independent of stress and strain in the fiber, which can lead to polarization rotation. While polarization-maintaining fiber was developed for use in fiber-based optical systems where polarization needs to be maintained, in the present application the use of such fiber adds cost to the system and also makes the manufacturing process more complex because the fiber needs be precisely aligned to the diode laser during assembly.

SUMMARY OF THE INVENTION

A first aspect of the invention is a laser system that provides a stable output. The system includes a laser with front and rear ends surrounding a gain medium. A first wavelength-selective reflective element with a first reflectivity bandwidth is optically coupled to the laser. Optically coupled to the laser through the first wavelength-selective reflective element is a second wavelength-selective reflective element with a second reflectivity bandwidth that at least partially overlaps the first reflectivity bandwidth. The first and second wavelength-selective reflective elements are arranged such that the laser exhibits stable operation in the coherence collapse regime.

In a second aspect of the invention, an optical system is used in the laser system to couple the laser to the wavelength-selective reflective elements. The optical system may be arranged between the laser and the first wavelength-selective reflective element, may encompass the first wavelength-selective reflective element only, the second wavelength-selective reflective element only, encompass both wavelength-selective reflective elements, or be arranged between the wavelength-selective reflective elements. The optical system may comprise an optical fiber, and the wavelength-selective reflective elements may include fiber Bragg gratings or thin-film filters.

A third aspect of the invention is a method of forming a laser system that produces a stable output. The method includes providing a laser having an output end. First and second spaced apart wavelength-selective reflective elements having at least partially overlapping reflectivity bandwidths are provided adjacent the output end. The first and second wavelength-selective reflective elements are then coupled to the output end to provide substantially incoherent optical feedback to the laser. The laser may include a diode laser with front and rear facets. Further, the first and second wavelength-selective reflective elements may include, for example, thin-film filters arranged in free-space or fiber Bragg gratings arranged in an optical fiber as part of an optical system coupled to the laser.

A fourth aspect of the invention is a method of generating a stabilized laser output. The method includes providing a laser having rear and front ends surrounding a gain medium, and optically coupling the laser to first and second spaced apart wavelength-selective reflective elements. The elements have at least partially overlapping reflectivity bandwidths and are arranged to provide incoherent optical feedback to the laser such that the laser generates a stable laser light output in a coherence collapse regime.

DETAILED DESCRIPTION OF THE INVENTION

In the following detailed description of the embodiments of the invention, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that changes may be made without departing from the scope of the present invention. The following detailed description is, therefore, not to be taken in a limiting sense, and the scope of the present invention is defined only by the appended claims.

Figure 1:
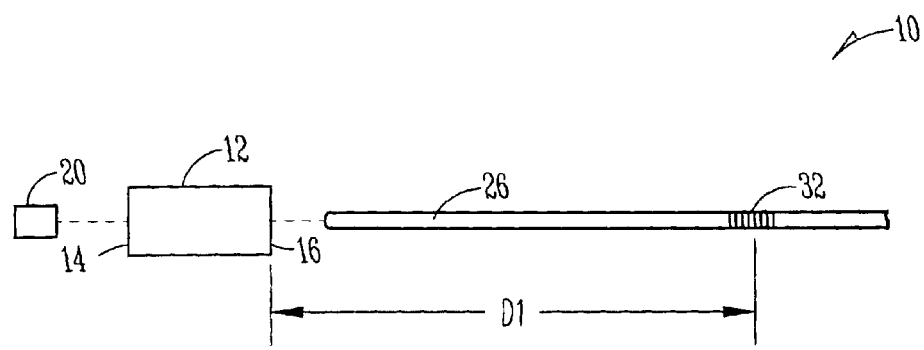
FIG. 1 is a schematic diagram of a prior art two-cavity fiber Bragg grating laser system.
Figure 2:
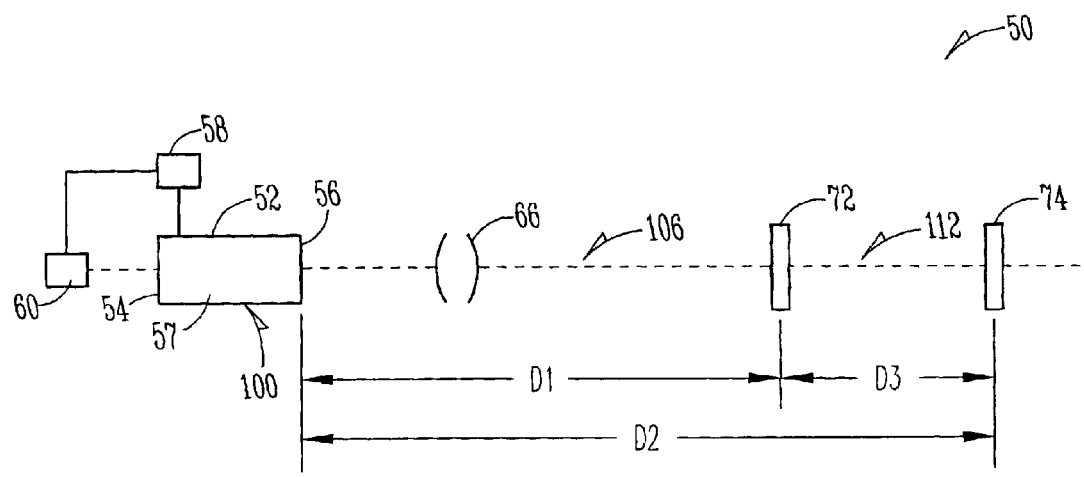
FIG. 2 is a schematic diagram of a three-cavity laser system that includes an optical system arranged between the laser and the first wavelength-selective reflective element.
Figure 3:
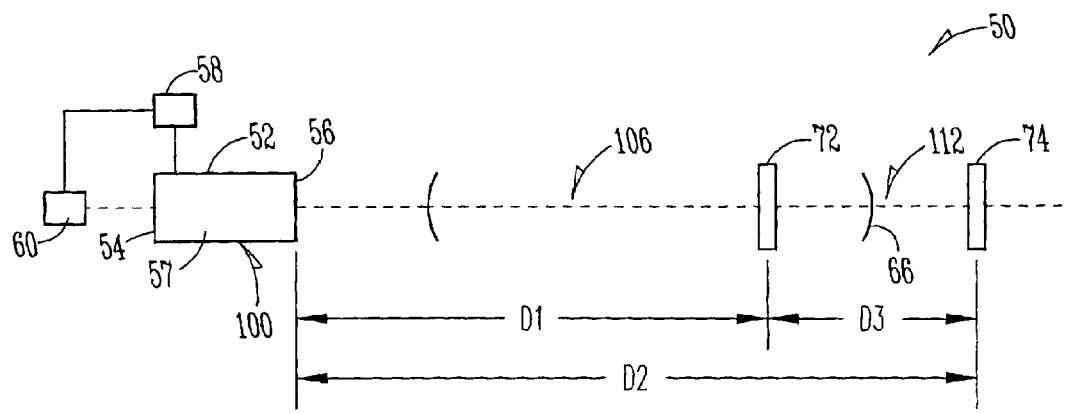
FIG. 3 is a schematic diagram of the laser system of FIG. 2, but with the optical system encompassing the first wavelength-selective reflective element.

With reference now to FIG. 2, there is shown a stabilized laser system 50 that includes a laser 52 with rear and front ends 54 and 56, respectively, between which is a gain medium 57. In an example embodiment, laser 52 is a diode laser and rear and front ends 54 and 56 are rear and front facets of the laser, where the front facet 56 has a reflectivity $R_{FF}$. An example diode laser is a single quantum well device emitting light at or near 980 nm, and that operates (lases) in a single longitudinal mode in the absence of optical feedback (i.e., as a free-running diode laser). Further in an example embodiment, laser 52 has a very coherent output that would require a single wavelength-selective reflective element to be placed relatively far (e.g., 90 cm or greater) from front end 56 of the laser to obtain stable coherence collapse operation.

System 50 further includes a power supply 58 connected to laser 52 to pump gain medium 57 so that the laser can emit light at a given output power level. Where laser 52 is a diode laser, power supply 58 includes a drive current supply (source) that provides a current to drive the diode laser.

Adjacent rear end 54 is a monitor 60 that is optically coupled to the rear end and electrically connected to power supply 58. Monitor 60 is used to monitor output power of the laser and provide feedback in the form of an electrical signal representative of the laser output to power supply 58 so that the amount of power (e.g., current) supplied to the laser can be controlled in order to maintain a constant output power. Where laser 52 comprises a laser diode, monitor 60 is a rear-facet monitor (RFM).

Optically coupled to laser 52 at front end 56 via an optical system 66 are first and second wavelength-selective reflective elements 72 and 74 having respective reflectivity bandwidths B1 and B2 within the gain bandwidth of laser 52. In an example embodiment, bandwidths B1 and B2 may range from about 0.1 nm to about 1 nm. Elements 72 and 74 also have respective reflectivities $R_{G1}$ and $R_{G2}$. Elements 72 and 74 are also respectively located at distances D1 and D2 from front end 56, and are spaced apart from one another by a distance D3 (D3=D2−D1). Reflectivity bandwidths B1 and B2 at least partially overlap, and in an example embodiment, completely overlap.

Further in an example embodiment, elements 72 and 74 are narrow-band thin film reflective filters, such as single-channel filters used for dense wavelength division multiplexing (DWDM). Such narrow band thin-film reflective filters are available from Corning, Inc., Endicott, N.Y.

In another example embodiment, elements 72 and 74 have substantially the same reflectivity, i.e., $R_{G1}=R_{G2}=R_G$, substantially the same reflectivity bandwidth, i.e., $B_1=B_2=B$, and substantially the same peak reflectivity at a center wavelength $\lambda_c$—in other words, the elements are preferably "matched," at least to within their design tolerance.

With continuing reference to FIG. 2, system 50 includes three discrete Fabry-Perot (FP) cavities. A first cavity 100 is within laser 52 itself and is defined by rear end 54 and front end 56, and includes gain medium 57. Cavity 100 lases, in the absence of external feedback, at a wavelength and a coherence length defined by the gain medium and laser cavity properties. A second FP cavity 106 is an "external cavity" defined by front end 56 and element 72. A third FP cavity 112 is also an external cavity defined elements 72 and 74.

A key aspect of system 50 involves properly selecting distances D1 and D3 (which also determines distance D2 via the relationship D2=D1+D3). When distances D1 and D3 are properly selected, third FP cavity 112 serves to destroy the coherence of the laser light reflected therefrom through Fabry-Perot interference. This in turn allows distance D1 to be substantially smaller than that of a two-cavity laser system, while still maintaining stable operation of the laser in the coherence collapse regime (and throughout the operating drive current range where laser 52 is a laser diode). In fact, in laser system 50 the distance D1 can be less than the coherence length of the free-running laser. Further, the distance D2 may also be within the coherence length of the free-running laser if the values D1 and D3 are properly selected.

The appropriate distances D1 and D3 for a given application may best be determined and selected empirically. For example, the different operational modes (e.g, stable and unstable) of laser system 50 for various laser geometries (i.e., distances D1 and D3) may be measured and plotted. The plot reveals regions in "D1-D3 space" in which the laser operation is stable and where it is unstable. An example of such a plot is discussed in greater detail below in connection with FIG. 9.

Once the appropriate values for distances D1 and D3 are selected, the operating wavelength of laser 52 is pulled to and maintained at the center wavelength $\lambda_c$ so that system 50 operates in a stable manner, e.g., reduced variation in the output wavelength as a function of temperature variations, drive current fluctuation and wavelength drift due to aging of the laser.

Alternative Optical System Embodiments

Figure 4:
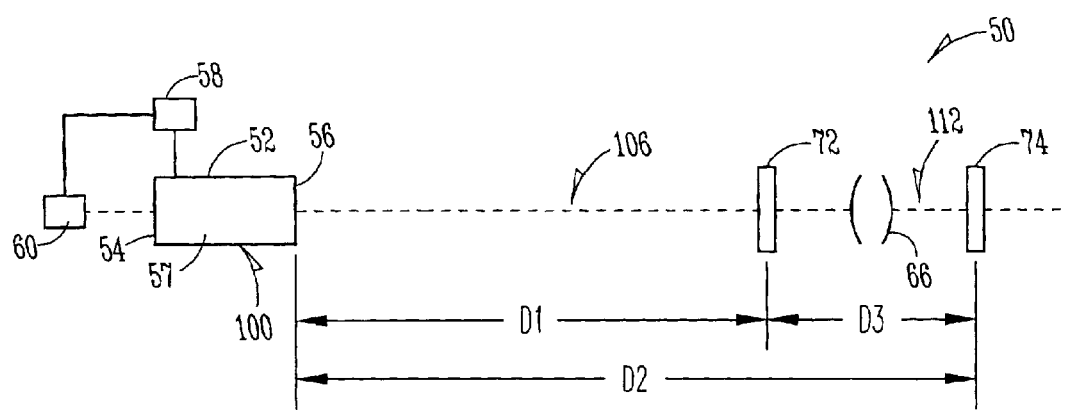
FIG. 4 is a schematic diagram of the laser system of FIG. 2, but with the optical system arranged between the first and second wavelength-selective reflective elements.
Figure 5:
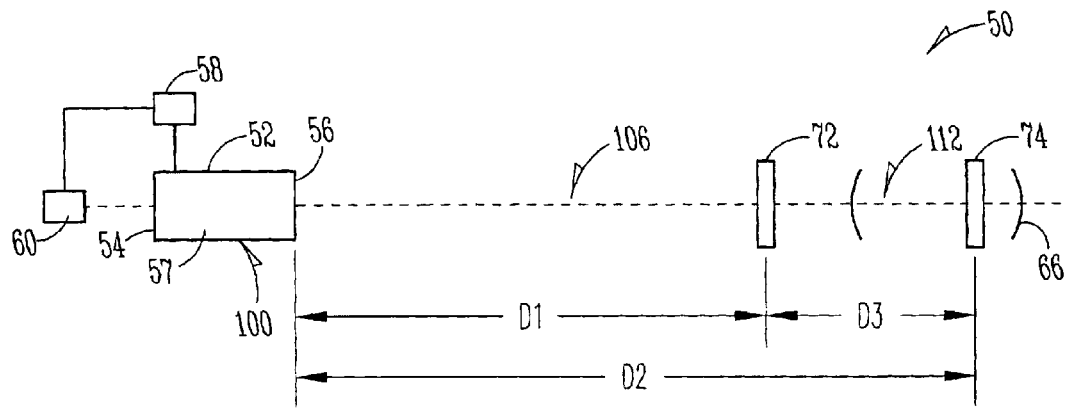
FIG. 5 is a schematic diagram of the laser system of FIG. 2, but with the optical system encompassing the second wavelength-selective reflective element.
Figure 6:
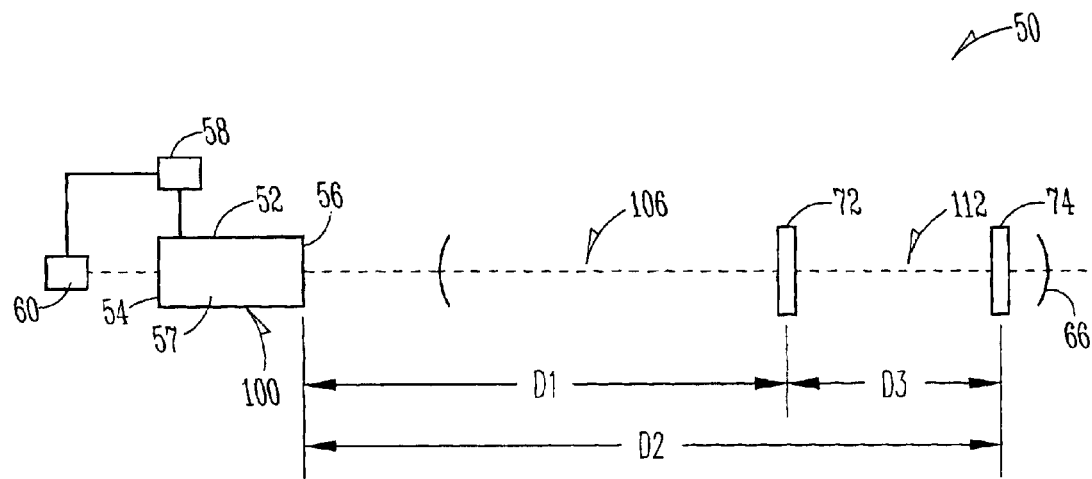
FIG. 6 is a schematic diagram of the laser system of FIG. 2, but with the optical system encompassing both wavelength-selective reflective elements.

The laser system 50 of FIG. 2 illustrates an embodiment where optical system 66 is arranged between the front end 56 of the laser and the first wavelength-selective reflective element 72. With reference now to FIGS. 3–6, there are shown alternative example embodiments of laser system 50 wherein optical system 66 is arranged to encompass element 72 only (FIG. 3), is arranged between elements 72 and 74 (FIG. 4), is arranged to encompass element 74 only (FIG. 5) or is arranged to encompass both elements 72 and 74 (FIG. 6). Further, combinations of the above geometries of optical system 66 illustrated in FIGS. 2–6 are possible. For instance, as one example, optical system 66 may include multiple sections, wherein one section of optical system 66 may be located as illustrated in FIG. 2, while another section of the optical system may be located as illustrated in FIG. 4.

Optical system 66 may include lens elements, mirrors, optical fibers, etc., arranged so that light from laser 52 is coupled to elements 72 and 74 and light reflected therefrom is coupled back into the laser.

Figure 7:
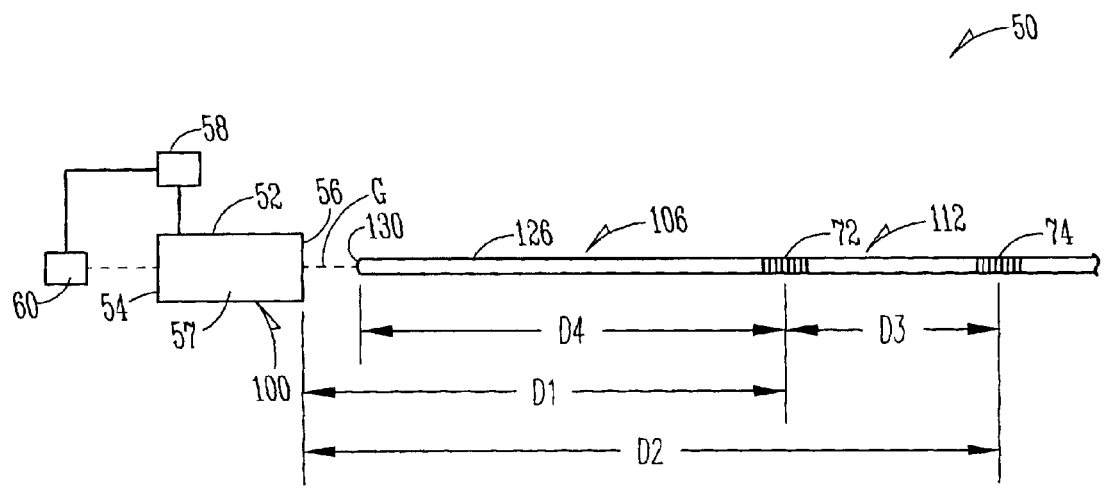
FIG. 7 is a schematic diagram of the laser system of FIG. 6 wherein the optical system includes an optical fiber.

FIG. 7 illustrates an example of a preferred embodiment of the laser system of FIG. 6, wherein optical system 66 comprises an optical fiber 126, and laser 52 comprises a diode laser. The laser system of FIG. 7 is now discussed in greater detail to illustrate a particular example embodiment of laser system 50.

Figure 8:
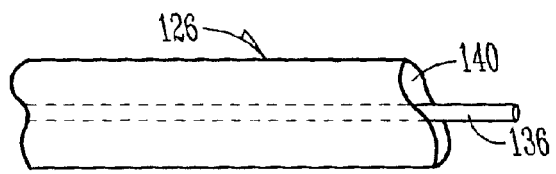
FIG. 8 is a close-up side cut-away view of the optical fiber of FIG. 7.

Optical fiber 126 has an end 130, a core region 136 and a cladding region 140 surrounding the core (FIG. 8). End 130 of optical fiber 126 is optically coupled to laser 52 at front end (facet) 56 so that light from the diode laser enters the optical fiber and is guided thereby. The optical coupling is performed using any one of a number of known techniques, including butt-end coupling, coupling with a separate lens, or coupling via a polished optical fiber end acting as a lens integral with the optical fiber. In an example embodiment, optical fiber 126 is single-mode optical fiber. In another example embodiment, optical fiber 126 is Corning Flexcore-1060, available from Corning, Inc., Corning, N.Y.

In laser system 50 of FIG. 7, wavelength-selective reflective elements 72 and 74 are formed in optical fiber 126. In an example embodiment, elements 72 and 74 are narrow-band thin-film filters. In another example embodiment, elements 72 and 74 are Bragg gratings formed in core 136 or cladding 140 of optical fiber 126. Regardless of the type of wavelength-selective reflective elements used, the light guided by fiber 126 is selectively reflected by the elements back toward diode laser 52 to provide incoherent optical feedback to the laser.

As discussed above, optical fiber 126 may be coupled to front facet 56 of diode laser 52 by placing optical fiber end 130 in close proximity to the front facet (e.g., butt-end coupling). In this case, distance D1 will be substantially the same as if measured from optical fiber end 130. Alternatively, the optical coupling of optical fiber 126 to front facet 56 using a lens (not shown) may leave a significant gap G between the front facet and optical fiber end 130. In this case, element 72 is formed a predetermined distance D4 from optical fiber end 130 to ensure that distance D1 is the desired distance when optical fiber 126 is coupled to diode laser 52 (i.e., D1=G+D4).

Determining the Operation Modes of the Laser System

The different operational modes (e.g, stable and unstable) of the laser system may be determined empirically by making measurements of the operational state of the laser for various laser geometries (i.e., distances D1 and D3) and plotting the results. The plot reveals regions in "D1-D3 space" in which the laser operation is stable and where it is unstable so that the appropriate distances D1 and D3 can be selected.

Figure 9:
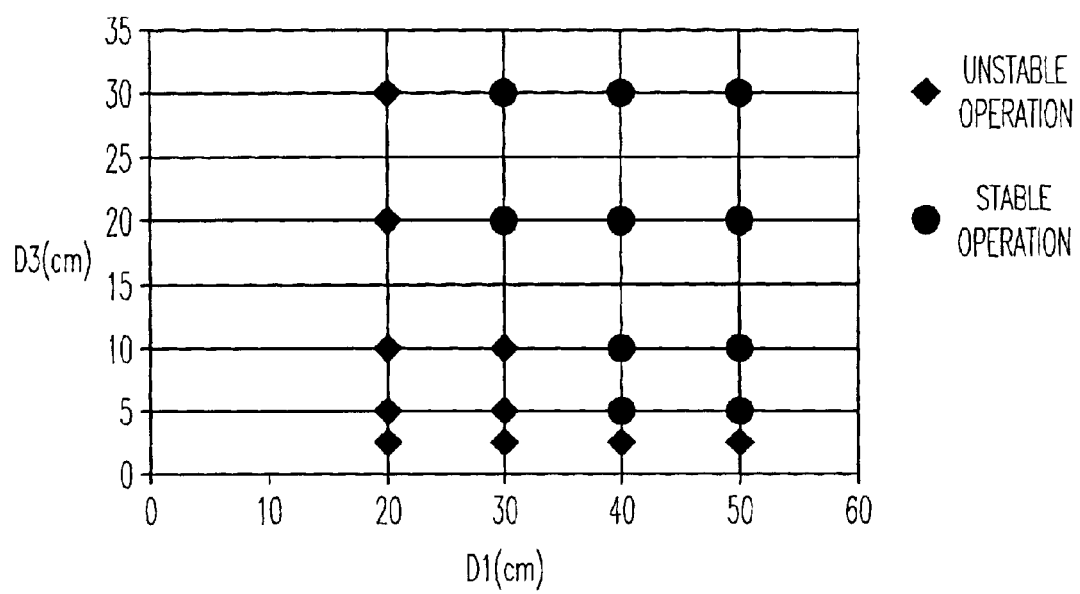
FIG. 9 is a plot of the operational modes (i.e., stable and unstable) of the laser system of FIG. 7 for various geometries as empirically determined by varying the distance D1 between the diode laser facet and the distance D3 between the fiber Bragg gratings.

FIG. 9 is a plot of the operational modes of laser system 50 of FIG. 7, with fiber Bragg gratings as the wavelength-selective reflective elements 72 and 74. In obtaining the data plotted in FIG. 9, experiments were performed for a matrix of distances D1 and D3, where distance D1 was varied between 20, 30, 40 and 50 cm, while distance D3 was varied between 2.5, 5, 10, 20 and 30 cm. The experiments involved splicing together different lengths of optical fibers containing fiber Bragg gratings to obtain an optical fiber with the desired element spacings. The optical fiber was then coupled to the diode laser and measurements of the drive current vs. output power were made.

In FIG. 9, it can be seen that for a distance D1 of 30 cm, stable operation of the diode laser occurs when distance D3 is between 20 cm and 30 cm. If the distance D1 is increased to 50 cm, then stable operation of the diode laser occurs when the distance D3 is as small as 5 cm. However, if distance D3 is decreased to 2.5 cm, the operation of the diode laser will be unstable.

It is important to note that because elements 72 and 74 can be positioned closer to diode laser 52 than a single element, the effect of birefringence-induced polarization rotation from the optical fiber is substantially reduced. This allows for the use of standard optical fiber instead of the specialized and more expensive polarization-maintaining fiber.

Also, with reference again to FIGS. 3–6, optical fiber 126 can be coupled at one end to the laser and terminated at or near wavelength-selective reflective element 72 so that there is guided-wave propagation of light to wavelength-selective reflective element 72 and free-space propagation of light to wavelength-selective reflective element 74. Likewise with reference to FIG. 4, optical fiber 126 can be arranged between elements 72 and 74 so that there is mostly or all free-space propagation from the laser to element 72 and then mostly or all guided-wave propagation between elements 72 and 74. With reference to FIG. 5, guided-wave propagation can be continued beyond element 74 by including element 74 as well by extending the optical fiber beyond this element. Thus, the various possible alternative arrangements of laser system 50 allows for a given laser system to include different types of wavelength-selective reflective elements, such as one fiber Bragg grating and one thin-film reflective filters, as well as utilize different forms of lightwave propagation (e.g., free-space or guided-wave).

Optical Telecommunications System

Figure 10:
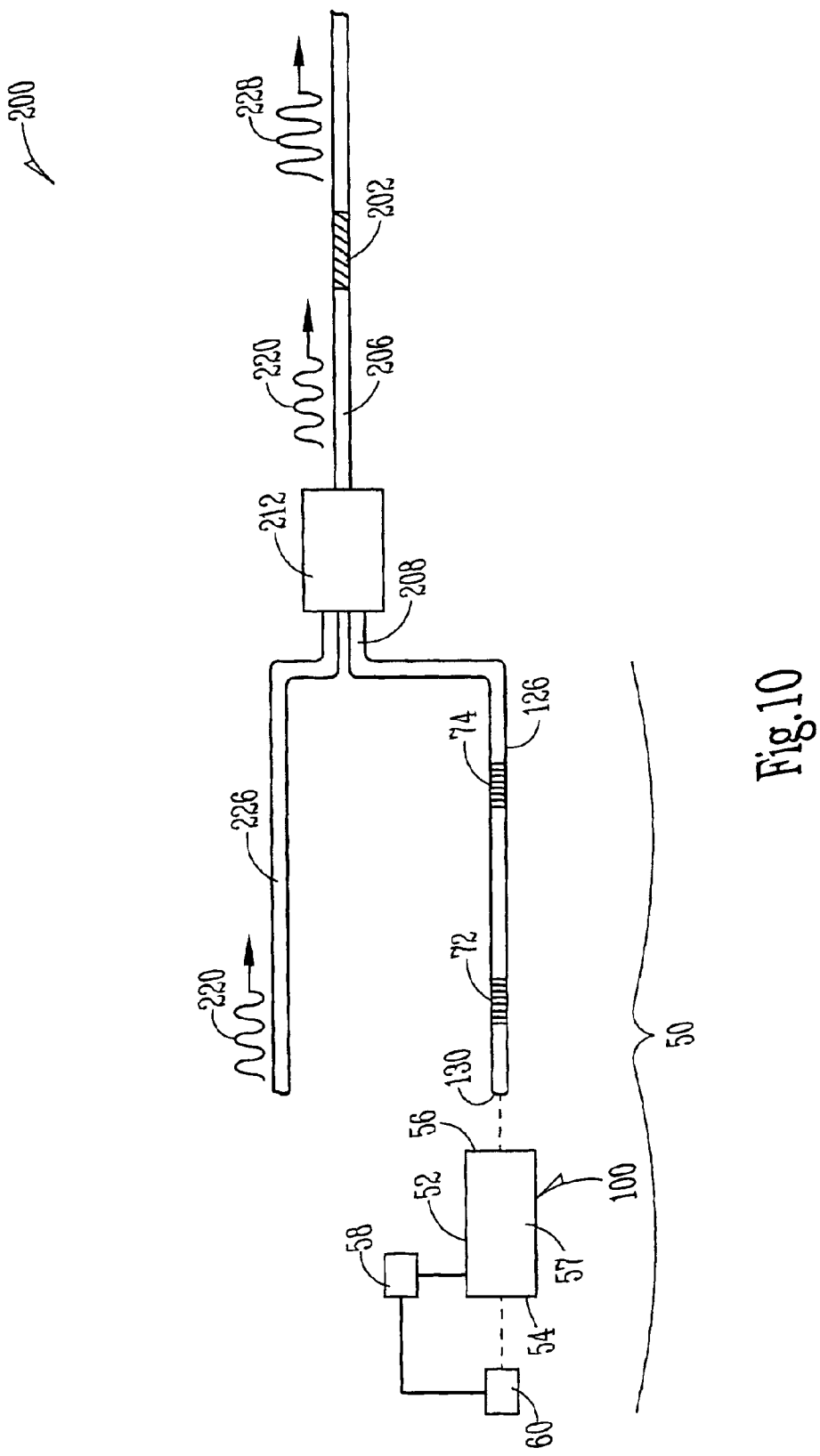
FIG. 10 is a schematic diagram of an optical telecommunication system that includes the laser system of FIG. 7 for energizing an active element.

With reference now to FIG. 10, there is shown a portion of a fiber optical telecommunications system 200 in which the laser system 50 of FIG. 7 serves to energize an active element 202 optically downstream of the laser system. In an example embodiment, element 202 is included in an optical fiber 206 that is coupled to optical fiber 126 at an end 208 opposite end 130 via an optical coupler 212. Optical coupler 212 may be, for example, a wavelength-division multiplexer (WDM). Element 202 may be, for example, an erbium-doped fiber amplifier (EDFA) that is energized (i.e., pumped) by the light from optical fiber 126. Element 202 may be arranged to receive an input signal 220 traveling along a section of optical fiber 226 that is also coupled to optical coupler 212. Element 202 then processes (e.g., amplifies, in the case of an EDFA element 202) input signal 220 to form an output optical signal 228.

Element 202 may also be a fiber laser having a pumping bandwidth at or near 980 nm. Optical signal 220 may include a plurality of channels (i.e., different multiplexed wavelengths of light).

An advantage of the use of diode laser system 50 of the present invention as part of telecommunication system 200 is that the length of optical fiber 126 can be significantly shorter than that used with a conventional diode laser system.

Figure 11A:
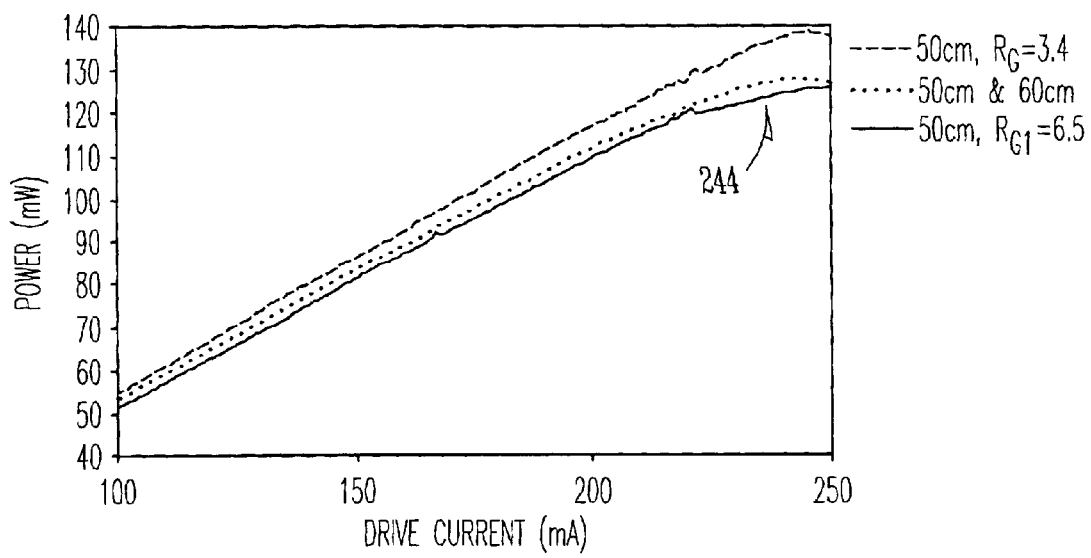
FIG. 11A includes plots of the output power (mW) versus drive current (mA) for three cases: (1) a two-cavity fiber Bragg grating laser system with a single grating having a power reflectivity $R_G=3.4\%$ (dashed curve) and located a distance D1=50 cm, (2) a three-cavity fiber Bragg grating laser system having two gratings at a distance D2=60 cm (dotted curve), and (3) a two-cavity fiber Bragg grating laser system with a single grating having a power reflectivity of $R_G=6.5\%$ (solid curve) and located a distance D1=50 cm.
Figure 11B:
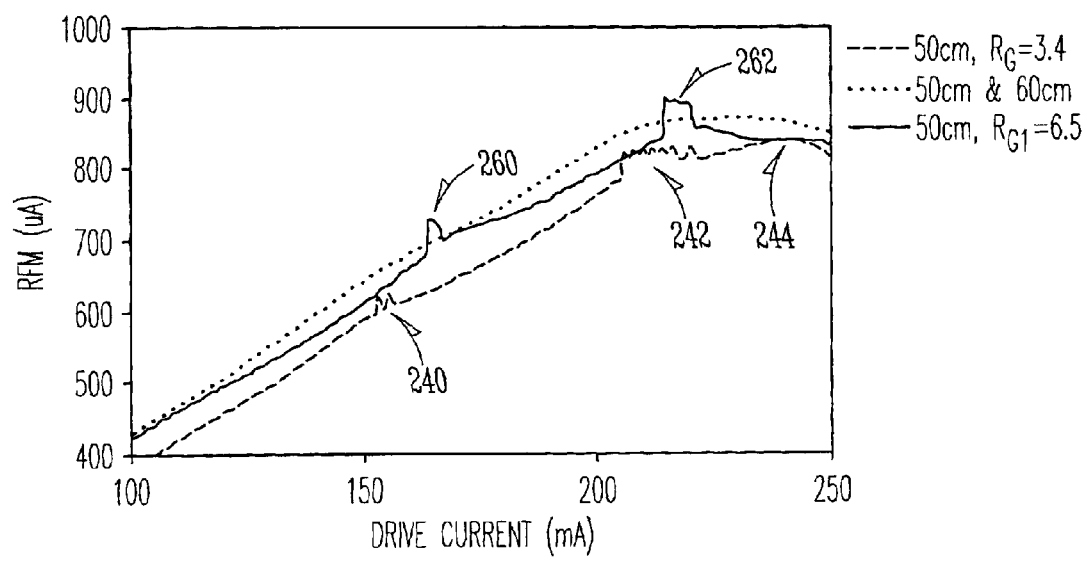
FIG. 11B includes plots of the RFM current ($\mu$A) vs. drive current (mA) for the same three cases as in FIG. 11A.

With reference now to FIGS. 11A and 11B, there are shown plots of the output power vs. drive current (FIG. 11A) and RFM current vs. drive current (FIG. 11B) for an example embodiment of laser system 50 where laser 52 is a diode laser having a nominal front facet reflectivity $R_{FF}$=4%. For a single element 72 in the form of a fiber Bragg grating having a reflectivity $R_{G1}$ of 3.4% and positioned such that distance D1=50 cm (dashed curve), the power and RFM current show two large instability regions 240 and 242 below the kink current 244 (at about 240 mA). It is typical that instabilities show up stronger in the RFM signal (FIG. 11B) measured at rear facet 54 than in the output power (FIG. 11A) measured at front facet 56. However, the issue of instabilities is important because monitor 60 is used to monitor output power and provide feedback to drive current supply 58 to control the drive current in order to maintain a constant output power.

A second reflective element 74 in the form of a fiber Bragg grating nearly identical to the first fiber Bragg grating 72 was then added at a distance D3=10 cm from the first fiber Bragg grating to create third cavity 112 in forming laser system 50 of FIG. 7 This laser system 50 operated in a stable condition throughout the drive current range (dotted curve). To demonstrate that the stability was not induced by simply increasing total reflectivity (which is 6.4% for cavity 112), a single fiber Bragg grating of the same reflection bandwidth and peak wavelength of the first two, but with a reflectivity $R_G$=6.5% was spliced and placed at a distance D1=50 cm. This higher reflectivity single fiber Bragg grating arrangement (solid curve) still exhibited instabilities 260 and 262 similar to instabilities 240 and 242 of the single fiber Bragg grating arrangement having 3.4% reflectivity (dashed curve).

Therefore, it is clear that the three-cavity laser system 50 enables stable operation in the coherence collapse regime in a manner different than that achieved by simply changing the feedback reflectivity of a two-cavity laser system.

While the present invention has been described in connection with preferred embodiments, it will be understood that it is not so limited. On the contrary, it is intended to cover all alternatives, modifications and equivalents as may be included within the spirit and scope of the invention as defined in the appended claims.

What is claimed is:

1. A laser system, comprising:
   a diode laser with an end facet and a front facet that surround a gain medium, the diode laser having a coherence length;
   a first optical fiber having a first end optically coupled to the front facet; and
   first and second wavelength-selective reflective elements formed in the first optical fiber and having at least partially overlapping respective first and second reflectivity bandwidths, the first and second wavelength-selective reflective elements being spaced apart from each other and from the front facet of the diode laser such that the laser system exhibits stable operation in the coherence collapse lasing regime, wherein the first wavelength-selective reflective element is closest to the front facet, and the distance from the front facet to the first wavelength-selective reflective element is substantially less than the coherence length of the diode laser.

2. The system of claim 1, wherein the first wavelength-selective reflective element is closest to the front facet, and wherein distance from the front facet to the first wavelength-selective reflective element is less than that possible for a single wavelength-selective reflective element used to maintain stable operation of the laser system in the coherence collapse regime.

3. The system of claim 1, wherein the diode laser has an operating wavelength pulled to and maintained at a wavelength set by the first wavelength-selective reflective element and the second wavelength-selective reflective element.

4. The system of claim 1, wherein the distance from the front facet to the second wavelength-selective reflective element is within the coherence length.

5. The system of claim 1, wherein at least one of the wavelength-selective reflective elements is a fiber Bragg grating.

6. The system of claim 5, wherein the first optical fiber has a core region, and wherein the at least one fiber Bragg grating is formed in the core region.

7. The system of claim 5, wherein the first optical fiber has a cladding region surrounding a core region, and wherein the at least one fiber Bragg grating is formed in the cladding region.

8. The system of claim 1, wherein the diode laser operates in a single longitudinal mode when free-running.

9. The system of claim 8, wherein the diode laser is a quantum-well-type laser lasing at or near 980 nanometers.

10. The system of claim 1, wherein the first and second wavelength-selective reflective elements are matched.

11. The system of claim 1, wherein the first and second reflectivity bandwidths are between about 0.1 nm and 1 nm.

12. The system of claim 1, further including:
  a drive current power supply electrically connected to the laser for pumping the gain medium; and
  a monitor optically coupled to the rear facet of the diode laser and electrically connected to the drive current power supply to provide an electrical signal to the drive current supply representative of output from the laser.

13. The system of claim 1, wherein the first optical fiber is single mode.

14. The system of claim 1, wherein the first optical fiber is not polarization maintaining.

15. The system of claim 1, further including a second optical fiber optically coupled to a second end of the first optical fiber, the second optical fiber having an active element that is energized by light emitted from the second end of the first optical fiber.

16. The system of claim 15, wherein the active element is an erbium-doped fiber amplifier.

17. The system of claim 15, wherein the active element is a fiber laser.

18. The system of claim 15, further including a third optical fiber coupled to the second optical fiber, wherein the third optical fiber provides an optical signal to be processed by the active element.

19. The system of claim 18, wherein the optical signal includes a plurality of channels corresponding to different wavelengths of light.

20. The system according to claim 18, wherein the active element is an erbium-doped fiber amplifier that amplifies the optical signal.

21. A laser system, comprising:
  a laser with front and rear ends surrounding a gain medium, the laser having a coherence length;
  a first wavelength-selective reflective element with a first reflectivity bandwidth optically coupled to the laser; and
  a second wavelength-selective reflective element with a second reflectivity bandwidth that at least partially overlaps the first reflectivity bandwidth, the second wavelength-selective reflective element optically coupled to the laser through the first wavelength-selective reflective element such that the laser exhibits stable operation in a coherence collapse regime, the first wavelength-selective reflective element exterior to the laser spaced from the front end at a distance substantially less than the coherence length of the laser.

22. The laser system of claim 21, wherein the laser is a diode laser and the front end includes a front facet and the rear end includes a rear facet.

23. The laser of claim 22, wherein the front and rear facets form a first Fabry-Perot (FP) cavity, the front facet and first wavelength-selective reflective element form a second FP cavity, and the first and second wavelength-selective reflective elements form a third FP cavity.

24. The laser system of claim 21, further including an optical system arranged downstream of the laser.

25. The laser system of claim 24, wherein the first wavelength-selective reflective element is encompassed by the optical system.

26. The laser system of claim 24, wherein the second wavelength-selective reflective element is encompassed by the optical system.

27. The laser system of claim 24, wherein the first and second wavelength-selective elements are encompassed by the optical system.

28. The laser system of claim 24, wherein the optical system is arranged between the first and second wavelength-selective reflective elements.

29. The system of claim 24, wherein the optical system includes a first optical fiber.

30. The system of claim 29, wherein the first and second wavelength-selective reflective elements are formed in the first optical fiber.

31. The system of claim 30, wherein at least one of the first and second wavelength-selective reflective elements includes a fiber Bragg grating.

32. The system of claim 21, wherein at least one of the first and second wavelength-selective reflective elements includes a thin-film reflective filter.

33. The system of claim 21, wherein the first wavelength-selective reflective element is spaced apart from the laser front end by a distance less than that required for a single wavelength-selective reflective element to maintain stable operation of the laser system in the coherence collapse regime.

34. The system of claim 21, wherein the first wavelength-selective reflective element and the second wavelength-selective reflective element are matched.

35. The system of claim 21, wherein the second wavelength-selective reflective element is within a coherence length of the diode laser.

36. The system of claim 21, further including:
  a power supply connected to the laser for pumping the gain medium; and
  a monitor optically coupled to the rear end of the laser and electrically connected to the power supply to provide an electrical signal representative of the laser output to the power supply.

37. The system of claim 36, wherein the laser includes a diode laser, the rear end includes a rear facet, the power supply includes a drive current power supply, and the monitor includes a rear facet monitor (RFM).

38. The system of claim 29, wherein a first end of the optical fiber is coupled to the laser, the system further including a second optical fiber optically coupled to a second end of the first optical fiber, the second optical fiber having an active element that is energized by light emitted from the second end of the first optical fiber.

39. The system of claim 38, wherein the active element is an erbium-doped fiber amplifier.

40. The system of claim 38, wherein the active element is a fiber laser.

41. The system of claim 38, further including a third optical fiber coupled to the second optical fiber, wherein the third optical fiber provides an optical signal to be processed by the active element.

42. The system of claim 38, wherein the optical signal includes a plurality of channels corresponding to different wavelengths of light.

43. A method of forming a laser system having a stable output, comprising:
  providing a laser having an output end, the laser having a coherence length; providing adjacent and spaced apart from the output end first and second spaced apart wavelength-selective reflective elements having at least partially overlapping reflectivity bandwidths;
  optically coupling the first and second spaced apart wavelength-selective reflective elements to the output end to provide substantially incoherent optical feedback to the laser, wherein at least one of the first spaced apart wavelength-selective reflective element and the second spaced apart wavelength-selective reflective element is coupled at a distance from the output end that is substantially less than the coherence length of the laser.

44. The method of claim 43, wherein the first wavelength-selective reflective element and the second wavelength-selective reflective element are matched.

45. The method of claim 44, further including locating the first and second wavelength-selective reflective elements within the coherence length.

46. The method of claim 43, including forming at least one of the first and second wavelength-selective reflective elements from a thin-film reflective filter.

47. The method of claim 43, including forming the first and second wavelength-selective reflective elements in a first optical fiber.

48. The method of claim 47, including spacing apart the first and second wavelength-selective reflective elements relative to the front end of the laser such that the effect of polarization rotation due to birefringence in the first optical fiber is reduced as compared to that using a single wavelength-selective reflective element.

49. The method of claim 47, wherein at least one of the first and second wavelength-selective reflective elements are fiber Bragg gratings.

50. The method of claim 43, wherein the laser includes a diode laser.

51. The method of claim 50, further including providing a drive current from a drive current supply to the diode laser to pump a gain medium within the diode laser.

52. The method of claim 51, further including monitoring the output of the diode laser from a rear facet opposite the front facet and providing an electrical signal representative of laser output to the drive current supply.

53. The method of claim 47, further including coupling a first end of the first optical fiber to the output end of the laser and energizing an active element with light emanating from a second end of the first optical fiber.

54. The method of claim 53, wherein energizing the active element includes optically pumping an erbium-doped fiber amplifier.

55. The method of claim 53, further including processing an optical signal with the active element.

56. The method of claim 55, wherein the processing of the optical signal includes amplifying the optical signal.

57. The method of claim 56, wherein amplifying the optical signal includes amplifying a plurality of channels at different wavelengths included in the optical signal.

58. A method of generating a stabilized laser output, comprising:
   providing a laser having rear and front ends surrounding a gain medium, the laser having a coherence length;
   optically coupling the laser to first and second spaced apart wavelength-selective reflective elements having at least partially overlapping reflectivity bandwidths to provide incoherent optical feedback to the laser such that the laser generates a stable laser light output in a coherence collapse regime, the first and second soaced apart wavelength-selective reflective elements external to the laser, wherein at least one of the first spaced apart wavelength-selective reflective element and the second spaced apart wavelength-selective reflective element is coupled at a distance from the front end that is substantially less than the coherence length of the laser.

59. The method of claim 58, including forming three distinct Fabry-Perot (FP) lasing cavities with the laser and first and second wavelength-selective reflective elements.

60. The method of claim 58, further including forming the first and second spaced apart wavelength-selective reflective elements within an optical system.

61. The method of claim 60, wherein the optical system includes a first optical fiber having an input end into which light from the laser is coupled, and an output end from which the stable laser light output emerges.

62. The method of claim 61, further including energizing an active element with light emanating from the output end of the first optical fiber.

63. The method of claim 62, wherein energizing the active element includes optically pumping an erbium-doped fiber amplifier.

64. The method of claim 62, further including processing an optical signal with the active element.

65. The method of claim 64, wherein the processing of the optical signal includes amplifying the optical signal.

66. The method of claim 65, wherein amplifying the optical signal includes amplifying a plurality of channels at different wavelengths included in the optical signal.

67. The method of claim 58, further including energizing an active element with the stable laser light output.

68. The method of claim 67, wherein energizing the active element includes optically pumping an erbium-doped fiber aniplifier.

69. The method of claim 67, further including processing an optical signal with the active element.

70. The method of claim 69, wherein the processing of the optical signal includes amplifying the optical signal.

71. The method of claim 70, wherein amplifying the optical signal includes amplifying a plurality of channels at different wavelengths included in the optical signal.

72. A laser system comprising:
   a diode laser with an end facet and a front facet that surround a gain medium, the diode laser having a coherence length;
   an optical fiber having a first end optically coupled to the front facet;
   first and second fiber Bragg gratings formed in the first optical fiber and having at least partially overlapping respective first and second reflectivity bandwidths, the first and second fiber Bragg gratings being spaced apart from each other and from the front facet such that the laser system includes three Fabry-Perot cavities and exhibits stable operation in the coherence collapse lasing regime, wherein at least one of the first fiber Bragg grating and the second fiber Bragg grating is coupled at a distance from the front end that is substantially less than the coherence length of the diode laser.

73. The laser system of claim 72, wherein the first and second fiber Bragg gratings are matched.

74. The laser system of claim 73, wherein the optical fiber is single mode.

75. The laser system of claim 74, wherein the diode laser operates in single longitudinal mode in the absence of optical feedback.

76. The laser system of claim 75, wherein the optical fiber has an end arranged adjacent the front facet, the optical fiber end being polished so as to form a lens integral with the optical fiber.

77. The laser system of claim 76, further including:
   a drive current power supply electrically connected to the diode laser for pumping the gain medium; and
   a monitor optically coupled to the rear facet of the diode laser and electrically connected to the drive current power supply to provide an electrical signal thereto.

78. The laser system according to claim 76, wherein the optical fiber is non-polarization maintaining.

79. A method of providing a stable output from a laser system, comprising:

providing a diode laser having an output end and a coherence length;

forming in an optical fiber first and second spaced apart fiber Bragg gratings having at least partially overlapping reflectivity bandwidths;

optically coupling the optical fiber to the output end to provide substantially incoherent feedback to the diode laser such that the diode laser operates in a coherence collapse regime, wherein at least one of the first spaced apart fiber Bragg grating and the second spaced apart fiber Bragg grating is coupled at a distance from the output end of the diode laser that is substantially less than the coherence length of the diode laser.

80. The method of claim 79, including positioning both the first and second spaced apart fiber Bragg gratings a distance from the output end that is equal to or less than the coherence length.

81. The method of claim 80, wherein the diode laser operates in a single longitudinal mode in the absence of optical feedback.

82. The method of claim 81, including polishing an end of the optical fiber and placing the polished end adjacent the output end.

83. The method of claim 82, including providing a drive current to the diode laser to pump the diode laser.

84. The method of claim 83, including monitoring the output of the diode laser from a rear facet opposite the front facet and providing and electrical signal representative of the output power to control the providing of the drive current.

85. The method of claim 84, wherein the laser diode includes a first Fabry-Perot (FP) cavity, and the first and second fiber Bragg gratings form second and third FP cavities.

86. The method of claim 85, wherein the first and second fiber Bragg gratings are matched.

* * * * *

UNITED STATES PATENT AND TRADEMARK OFFICE
CERTIFICATE OF CORRECTION

PATENT NO. : 6,778,583 B2
DATED : August 17, 2004
INVENTOR(S) : Crawford et al.

It is certified that error appears in the above-identified patent and that said Letters Patent is hereby corrected as shown below:

Title page,
Item [75], Inventors, delete "McGowen" and insert -- McGowan --, therefor.
Item [73], Assignee, delete "Praire" and insert -- Prairie --, therefor.
Item [56], References Cited, OTHER PUBLICATIONS, "Henry," reference, after "C" insert -- . --.

Drawings,
Sheet 6 of 6, Fig. 11B, in "Y-Axis Label", delete "uA" and insert -- $\mu$A --, therefor.

Column 1,
Line 15, delete "amplifers" and insert -- amplifiers --, therefor.
Line 59, after "$R_{FF}$" insert -- . --.

Column 2,
Line 4, delete "IEE" and insert -- IEEE --, therefor.

Column 4,
Line 57, delete "N.Y." and insert -- NY. --, therefor.

Column 6,
Line 9, delete "N.Y." and insert -- NY. --, therefor.

Column 7,
Line 65, after "FIG. 7" insert -- . --.

Column 11,
Line 58, delete "soaced" and insert -- spaced --, therefor.

Column 12,
Line 25, delete "aniplifier" and insert -- amplifier --, therefor.

UNITED STATES PATENT AND TRADEMARK OFFICE
CERTIFICATE OF CORRECTION

PATENT NO. : 6,778,583 B2
DATED : August 17, 2004
INVENTOR(S) : Crawford et al.

It is certified that error appears in the above-identified patent and that said Letters Patent is hereby corrected as shown below:

Column 14,
Line 11, delete "and" and insert -- an --, therefor.

Signed and Sealed this

Thirtieth Day of November, 2004

JON W. DUDAS
*Director of the United States Patent and Trademark Office*